(12) United States Patent
Manian et al.

(10) Patent No.: US 12,425,276 B2
(45) Date of Patent: Sep. 23, 2025

(54) EQUALIZATION ADAPTATION ENGINE ASSISTED BASELINE WANDER CORRECTION OF DATA

(71) Applicant: TEXAS INSTRUMENTS INCORPORATED, Dallas, TX (US)

(72) Inventors: Abishek Manian, San Jose, CA (US); Amit Rane, Santa Clara, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 8 days.

(21) Appl. No.: 17/588,706

(22) Filed: Jan. 31, 2022

(65) Prior Publication Data

US 2023/0246884 A1  Aug. 3, 2023

(51) Int. Cl.
*H04L 25/03* (2006.01)
*H03F 3/04* (2006.01)
*H03K 17/687* (2006.01)
*H04B 1/16* (2006.01)

(52) U.S. Cl.
CPC ......... *H04L 25/03057* (2013.01); *H03F 3/04* (2013.01); *H03K 17/6872* (2013.01); *H04B 1/16* (2013.01); *H03F 2200/165* (2013.01)

(58) Field of Classification Search
CPC .......... H04L 25/03057; H03F 3/04; H03F 2200/165; H03K 17/6872; H04B 1/16
USPC .......................................................... 375/233
See application file for complete search history.

(56) References Cited

U.S. PATENT DOCUMENTS

2019/0103875 A1*  4/2019  Crain ............... H04L 7/048

* cited by examiner

*Primary Examiner* — Leila Malek
(74) *Attorney, Agent, or Firm* — Mandy Barsilai Fernandez; Frank D. Cimino

(57) ABSTRACT

Systems, circuitry and methods correct baseline wander while reducing amplitude difference between the input signal to a data sampler and the output signal of an output-swing-controlled buffer. Example baseline wander correction circuitry comprises a baseline wander correction loop that receives an equalized data signal, a feedback signal and a buffer control signal, and corrects baseline wander in the data sampler input signal. Baseline wander correction loop generates the buffer output signal based on the data sampler output signal and the buffer control signal. Baseline wander correction circuitry also comprises a feedback circuit that receives the data sampler output signal and generates the feedback signal, and an amplitude estimation loop that receives the data sampler input and output signals and outputs the buffer control signal to control the peak-to-peak swing of the buffer output signal.

29 Claims, 12 Drawing Sheets

EQUALIZATION ADAPTATION ENGINE ASSISTED BASELINE WANDER CORRECTION OF DATA

FIELD OF DISCLOSURE

This disclosure relates generally to correcting baseline wander in received data in communication applications, e.g., those that employ equalizer adaptation such as re-timers, and more particularly to a baseline wander correction scheme that incorporates signal amplitude estimation using an on-board equalization adaptation engine controlled to avoid estimation and correction when a pathological data pattern is detected.

BACKGROUND

When a transmitter transmits a data-containing signal (data signal or simply signal) through a communication channel, the signal exiting the channel may be distorted relative to the signal received by a receiver. For example, in a typical transmitter-receiver communication system with matched impedance, an AC coupling capacitor (or multiple capacitors coupled in series) is disposed between the channel and receiver to isolate the DC bias settings of the transmitter and receiver circuits and to accommodate different common mode voltages at the two ends.

However, the AC coupling capacitor(s), together with resistance coupled between the capacitor output and ground at the input of the receiver, and the output impedance of the transmitter, act as a high-pass filter to block or attenuate lower frequency content in the data below the cutoff frequency of the filter. Moreover, in some applications, such as serial digital interface (SDI) video applications, data patterns with DC imbalances occur. These localized DC imbalanced data patterns, known as disruptive or pathological data patterns, may cause the AC coupling capacitor(s) to store a non-zero average value, which leads to a shifting of the data-zero crossing (baseline) with respect to the data input to a sampler or slicer in the receiver. This shifting of the data-zero crossing is sometimes referred to as baseline wander (BLW) or DC wander. For example, the input data may have a relatively long run (e.g., ~15 microseconds) of 19 high level bits (1's) and 1 low level bit (0) that moves the baseline down, and at some other time during data transmission, have a relatively long run (e.g., ~15 microseconds) of 1 high level bit (1) followed by 19 low level bits (0's) that moves the baseline up. If not corrected, BLW is hard-coded as deterministic jitter as soon as slicing or sampling occurs in the receiver.

A conventional approach to this issue, which has been employed in SDI applications, is to use a quantized feedback loop with analog amplitude estimation in the receiver. However, this approach is susceptible to rail out in the presence of offset due to positive feedback, leading to increased bit errors. Moreover, the amplitude estimation loop uses energy detection filters and rectifiers that are prone to inaccuracies due to offsets, data patterns, and other non-idealities. Thus, the baseline wander in the signal may corrupt the amplitude estimate. While the quantized feedback may be replaced by a feedforward circuit to prevent rail out, the feedforward circuit cannot accurately cancel baseline wander.

A solution to baseline wander is thus desirable.

SUMMARY

In an example, baseline wander correction circuitry comprises a baseline wander correction loop having a data input, a control signal input, a first output (at which a signal, e.g., $LIN_{out}$ is output) and a second output (at which a signal, e.g., $LA_{in}$ is output). The data input is configured to receive an equalized data signal. The baseline wander correction circuitry further comprises an amplitude estimation loop having first and second inputs coupled to the first and second outputs of the baseline wander correction loop, respectively, and having a control signal output coupled to the control signal input of the baseline wander correction loop.

In an example, a system comprises a baseline wander correction loop and an amplitude estimation loop. The baseline wander correction loop includes circuitry configured to receive a data input signal, sum the data input signal with a first feedback signal to generate a data sampler input signal (e.g., $LIN_{out}$), and control a low frequency portion of the data sampler input signal to be approximately equal to a low frequency portion of a buffer output signal (e.g., $LA_{out}$). The amplitude estimation loop includes circuitry configured to control an amplitude of the buffer output signal to be approximately the same as an amplitude of the data sampler input signal.

In an example, a method comprises sampling an input signal (e.g., $LIN_{out}$) to generate a sampled signal (e.g., $LA_{in}$); applying the sampled signal to an output-swing-controlled buffer to generate a buffer output signal (e.g., $LA_{out}$); low-pass filtering the input signal and the buffer output signal to generate a low-pass filtered input signal (e.g., $LIN_{lpf}$) and a low-pass filtered buffer output signal (e.g., $LA_{lpf}$); inputting the low-pass filtered input signal and the low-pass filtered buffer output signal as a differential signal to an amplifier; and amplifying the differential signal using the amplifier to generate a feedback signal.

In an example, a circuit comprises first and second operational amplifiers, each having first and second inputs and an output, where the first and second inputs are configured to receive a differential input voltage signal. The circuit further comprises a p-type metal-oxide-silicon field-effect (PMOS) transistor having a gate terminal and first and second current terminals, where the gate terminal of the PMOS transistor is coupled to the output of the first operational amplifier, the first current terminal of the PMOS transistor is adapted to be coupled to a supply voltage, and the second current terminal of the PMOS transistor is coupled to the second input of the first operational amplifier. The circuit further comprises an n-type metal-oxide-silicon field-effect (NMOS) transistor having a gate terminal and first and second current terminals, where the gate terminal of the NMOS transistor is coupled to the output of the second operational amplifier, the first current terminal of the NMOS transistor is adapted to be coupled to ground, and the second current terminal of the NMOS transistor is coupled to the second input of the second operational amplifier. A (first) resistive element of the circuit is coupled between the second current terminals of the PMOS and NMOS transistors.

These and other features will be better understood from the following detailed description with reference to the accompanying drawings.

BRIEF DESCRIPTION OF THE DRAWINGS

Features of the disclosure may be understood from the following figures taken in conjunction with the detailed description.

The same reference numbers and other reference designators are used in the drawings to designate the same or similar (structurally and/or functionally) features.

DETAILED DESCRIPTION

Figure 1:
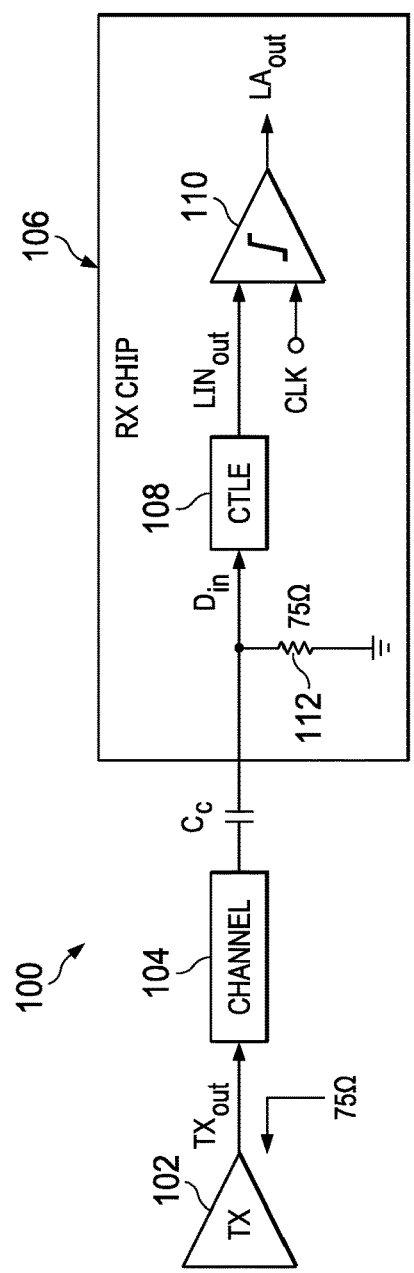
FIG. 1 is a diagram of an example communication system including a transmitter, communication channel and receiver.

Specific examples are described below in detail with reference to the accompanying figures. These examples are not intended to be limiting. The objects depicted in the drawings are not necessarily drawn to scale.

In example arrangements, a baseline wander correction scheme uses an equalization adaptation engine, e.g., a sign-sign least-mean-squares (SS-LMS) equalization adaptation engine, to periodically estimate the amplitude of a received signal, in addition to running a baseline wander correction circuit to correct baseline wander. In an example, to increase amplitude estimation accuracy, the equalization adaptation engine is enabled for the estimation function only when no pathological data pattern is detected. In an example, the equalization adaptation engine is the same as that used for fine equalization adaptation, thus yielding power and space savings. In an example, the equalization adaptation engine operates in the digital domain, which provides amplitude estimates that are less sensitive to offsets and other non-idealities of analog amplitude calibration. In an example, baseline wander correction circuitry includes a limiting buffer with a controllable (programmable) output (e.g., voltage) signal swing, and a high-gain dual-feedback loop.

FIG. 1 is a diagram of a communication system 100 that includes a transmitter (TX) 102 that outputs a signal ($TX_{out}$), which may be a high-speed signal, that propagates through a communication channel 104, which may be a cable or a trace on a PCB, to a receiver (RX) 106. Circuit components of receiver 106 may be fabricated on a semiconductor substrate to form an RX chip. Each of transmitter 102 and receiver 106 may be any of various electronic devices. For example, communication system 100 may be embodied in an SDI video application that employs a re-timer.

Receiver 106 may include a continuous time linear equalizer (CTLE) 108 that receives an input signal ($D_{in}$) and a circuit 110 that embodies the functionality of a sampler (or slicer) as well as other signal processing circuitry including an amplifier. Circuit 110, which is coupled to CTLE 108, samples its output using a sampling clock signal (CLK) and further processes the sampled signal to generate an output signal ($LA_{out}$).

Receiver 106 includes a resistor 112 having a resistance to match the impedance of transmitter 102, which impedance may be 75Ω. An AC coupling capacitor ($C_c$), which may represent multiple capacitors coupled in series, is disposed between channel 104 and receiver 106 to isolate the DC bias settings of transmitter 102 and receiver 106 and to accommodate different common mode voltages at the two ends.

However, as previously noted, the AC coupling capacitor (s), together with resistor 112 and the impedance of transmitter 102, act as a high-pass filter to block or attenuate lower frequency content in the data below the cutoff frequency of the filter. Moreover, in some applications, such as SDI video applications, data patterns with local DC imbalances occur. Such data patterns, known as disruptive or pathological data patterns, may cause the AC coupling capacitor(s) to store a non-zero average value, which leads to a shifting of the data-zero crossing (baseline) with respect to the data input to sampler 110 in receiver 106. This shifting of the data-zero crossing may be referred to as baseline wander (BLW) or DC wander. A particular pathological data pattern, e.g., a long run (e.g., ~15 microseconds) of 19 high level bits (1's) and 1 low level bit (0) tends to move the baseline down, while another pathological data pattern, e.g., a relatively long run (e.g., ~15 microseconds) of 1 high level bit (1) followed by 19 low level bits (0's) tends to move the baseline up. If not corrected, BLW is hard-coded as deterministic jitter when slicing or sampling occurs in receiver 106.

Figure 2:
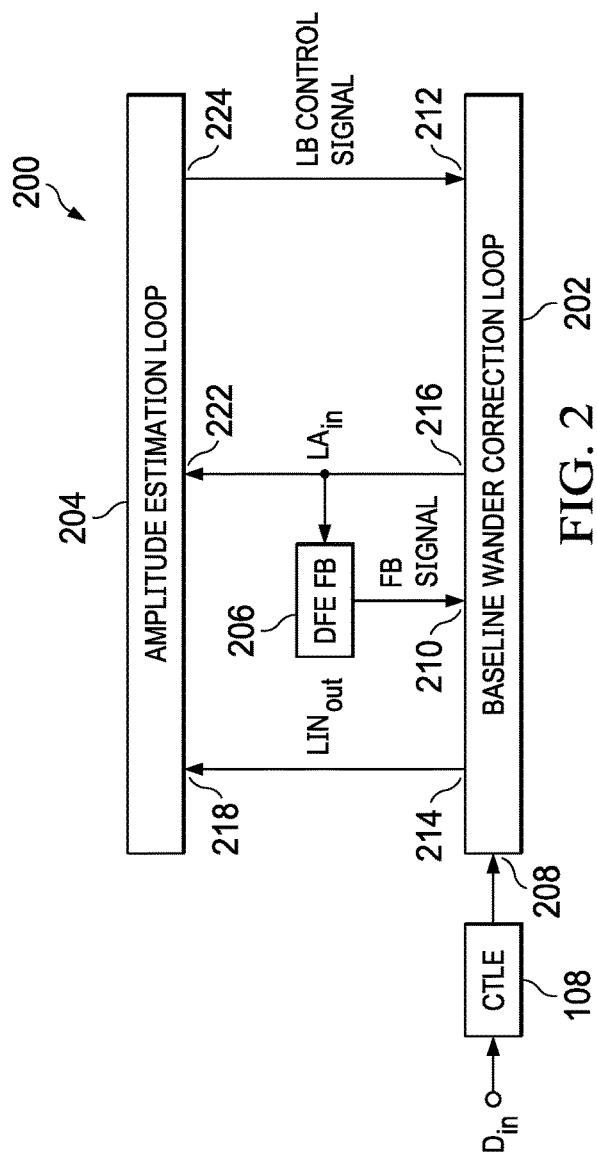
FIG. 2 is a diagram of example baseline wander correction circuitry.

To address these issues, receiver 106 may include baseline wander correction circuitry 200 shown schematically in FIG. 2. Baseline wander correction circuitry 200 includes a baseline wander correction loop 202, and an amplitude estimation loop 204. In an example, baseline wander correction circuitry 200 may also include a decision feedback equalizer (DFE) feedback module (DFE FB) 206. Baseline wander correction loop 202 has a data input 208 to receive an equalized signal output from CTLE 108, and a control signal input 212 to receive a control signal (LB control signal) for a limiting buffer within baseline wander correction loop 202. In an architecture in which DFE FB 206 is used, baseline wander correction loop 202 also includes a feedback signal input 210 to receive a feedback signal from DFE FB 206. Baseline wander correction loop 202 has outputs 214 and 216. A summer output signal ($LIN_{out}$) and a limiting buffer input signal ($LA_{in}$), both of which are also used internally by baseline wander correction loop 202, are transmitted to amplitude estimation loop 204 at outputs 214 and 216, respectively. Internally, baseline wander correction loop 202 generates a buffer output signal ($LA_{out}$).

Amplitude estimation loop 204 has corresponding inputs 218 and 222 respectively coupled to outputs 214 and 216 to receive $LIN_{out}$ and $LA_{in}$. Amplitude estimation loop 204 also has an output 224 coupled to input 212 for delivering the LB control signal to baseline wander correction loop 204.

Figure 3:
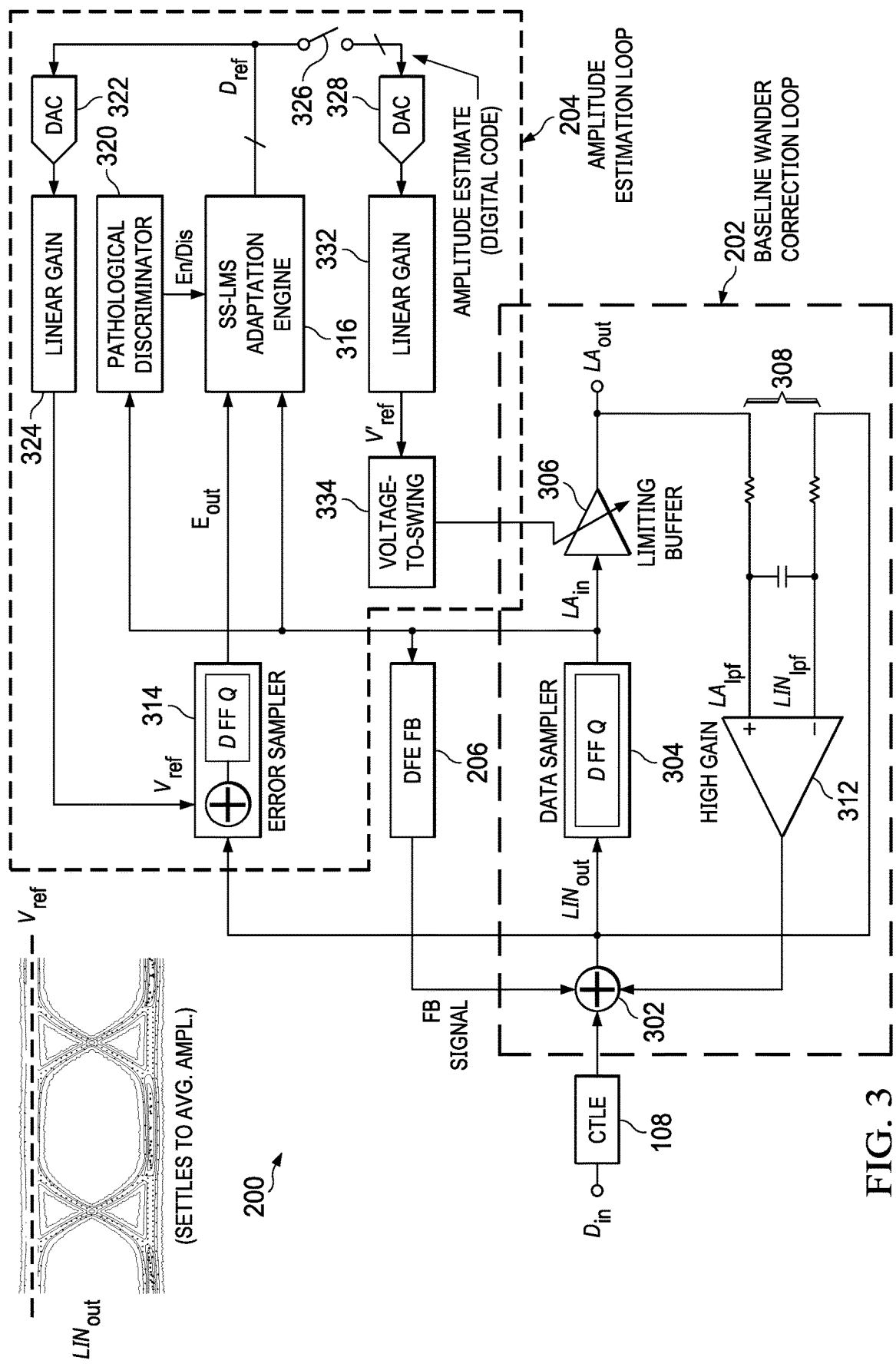
FIG. 3 is a diagram of components of a baseline wander correction loop and an amplitude estimation loop of baseline wander correction circuitry.

FIG. 3 is a schematic illustration showing components of baseline wander correction loop 202 and amplitude estimation loop 204 of baseline wander correction circuitry 200. A high-gain dual-loop feedback within baseline wander correction circuitry 200 operates to make the low frequency content, e.g., <25 kHz, of $LIN_{out}$ approximately equal to that of $LA_{out}$, which signal is retimed to replicate or closely approximate $TX_{out}$, i.e., the output of transmitter 102. To that end, baseline wander correction loop 202 includes a summer 302 configured to receive the output signal from CTLE 108. Summer 302 also receives two other signals: the feedback signal from DFE FB module 206 and the output of a high-gain amplifier 312. Based on these input signals, summer 302 generates and outputs $LIN_{out}$. Summer 302 may be implemented as a single summer as shown, or as two summers, i.e., (1) a DFE summer and (2) a baseline wander correction summer, configured in cascade. A data sampler 304 is configured to receive and sample $LIN_{out}$ to generate data sampler output signal $LA_{in}$. Data sampler 304 may be implemented as a flip-flop, i.e., a D flip-flop that also includes a clock signal input (not shown). $LA_{in}$ is input to a limiting buffer 306, as well to DFE FB 206, which functions as the feedback circuit of a DFE, which outputs a weighted summation of multiple DFE taps (i.e., 0-UI, 1-UI, 2-UI, . . . , etc. delayed versions of $LA_{in}$). DFE FB 206 generates a feedback (FB) signal that is input to summer 302, which FB signal is explained in more detail with respect to FIG. 5. With this configuration, data sampler 304 and limiting buffer 306 function as a replica transmitter to conform $LA_{out}$ to $TX_{out}$. Limiting buffer 306 is controlled via amplitude correction loop 204, as described in more detail below.

As part of the high-gain dual-loop feedback, the output of limiting buffer 306, $LA_{out}$, together with the output of summer 302, $LIN_{out}$, are input to a differential low-pass filter 308 comprised of a pair of resistors, one in each input path of low-pass filter 308, and a capacitor coupling the two input paths downstream of the resistors. Low-pass filter 308 thus outputs corresponding low-pass filtered signals $LA_{lpf}$ and $LIN_{lpf}$, which are input to high-gain amplifier 312. In an example, $LA_{lpf}$ is input to a positive (+) input terminal of high-gain amplifier 312 and $LIN_{lpf}$ is input to a negative (−) input terminal of high-gain amplifier 312. The output of high-gain amplifier 312 is fed back to summer 302, which also receives the output of CTLE 108 and the output of DFE FB module 206. DFE FB module 206 achieves ISI-equalization, and baseline wander correction feedback achieves DC wander correction.

To improve the accuracy of the baseline (DC) wander correction, the amplitude of $LIN_{out}$ and $LA_{out}$ should be approximately equal. This function is performed by amplitude estimation loop 204.

Amplitude estimation loop 204 includes an error sampler 314 that is comprised of a summer ⊕ and a flip-flop, e.g., a D flip-flop. Error sampler 314 operates in conjunction with data sampler 304 in that both receive an input voltage, i.e., $LIN_{out}$. Error sampler 314 also receives an error reference voltage ($V_{ref}$). Error sampler 314 samples $LIN_{out}$ and $V_{ref}$, determines the difference between two corresponding samples of $LIN_{out}$ and $V_{ref}$, latches the difference in accordance with a clock signal (not shown) input to error sampler 314, and provides an error signal ($E_{out}$), which is indicative of the difference between $LIN_{out}$ and $V_{ref}$, to an equalization adaptation engine 316. In an example, equalization adaptation engine is an SS-LMS equalization adaptation engine (SS-LMS). SS-LMS 316 also receives $LA_{in}$ as an input, and based on these inputs, outputs an error sampler code ($D_{ref}$). $D_{ref}$ is fed back via a digital-to-analog converter (DAC) 322 to a linear gain circuit 324 that adjusts the gain of the analog signal counterpart to $D_{ref}$, the result of which is $V_{ref}$, which is output by linear gain circuit 324.

Through the process performed by amplitude estimation loop 204, $V_{ref}$ settles to the average amplitude of $LIN_{out}$, as shown in the eye diagram accompanying FIG. 3. With the output of data sampler 304, i.e., $LA_{in}$, at 1, $V_{ref}$ is set such that the probability that $E_{out}$ is 1 is 0.5. That is, $P(E_{out}=1)=0.5$. Then, $V_{ref}[n]=V_{ref}[n-1]+\Delta V_{ref} \text{sign}(E_{out})$.

In an example, operation of SS-LMS 316 is gated by a pathological discriminator 320, so only non-pathological portions of $LA_{in}$ are used by SS-LMS 316 in generating error sampler code $D_{ref}$. To this end, pathological discriminator 320 includes circuitry to detect whether $LA_{in}$ has any pathological data pattern. Hence, pathological discriminator 320 has an input at which $LA_{in}$ is received and an output at which an enable/disable signal (En/Dis) is output to SS-LMS 316. In an example, upon detecting a pathological data pattern, pathological discriminator 320 outputs the disable signal to SS-LMS 316 to avoid a likely inaccurate amplitude estimation, and once $LA_{in}$ is free of any pathological data pattern, pathological discriminator 320 outputs the enable signal. The interaction between SS-LMS 316 and pathological discriminator 320 may be configured such that SS-LMS 316 is enabled unless a disable signal is asserted.

When not disabled, the output of SS-LMS 316 ($D_{ref}$) is sampled by periodic actuation of a switch 326, operation of which may be programmed or controlled by a timer. The periodically sampled value of $D_{ref}$ is an amplitude estimation code (digital value), which is input to another DAC 328 and linear gain circuit 332 assembly that outputs another analog reference voltage ($V'_{ref}$), which may be considered an amplitude estimation parameter. $V'_{ref}$ is then input to a voltage-to-swing converter 334, the output of which may represent a swing control parameter used to control limiting buffer 306, as shown and described with reference to FIG. 4.

Figure 7:
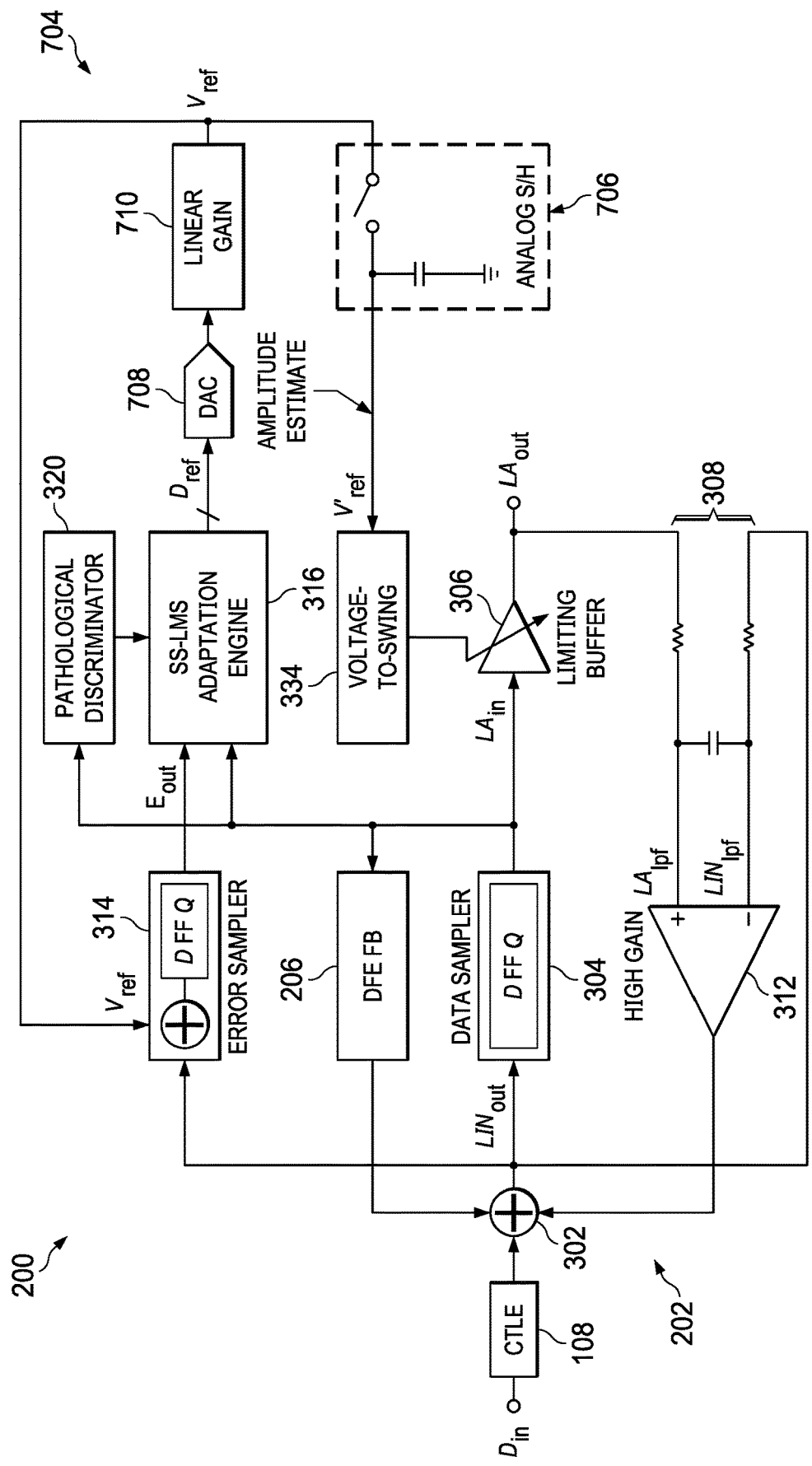
FIG. 7 is a diagram showing an alternative implementation of amplitude estimation loop of baseline wander correction circuitry.

At least some of the signals shown and described in FIG. 3 are differential signals, as will become clear in the following description. The single arrow signal notation used in FIG. 3, as well as in FIG. 7, is for clarity. Thus, recitation in the singular, i.e., "an input" or variation thereof, in the claims is intended to cover a differential input.

Figure 4:
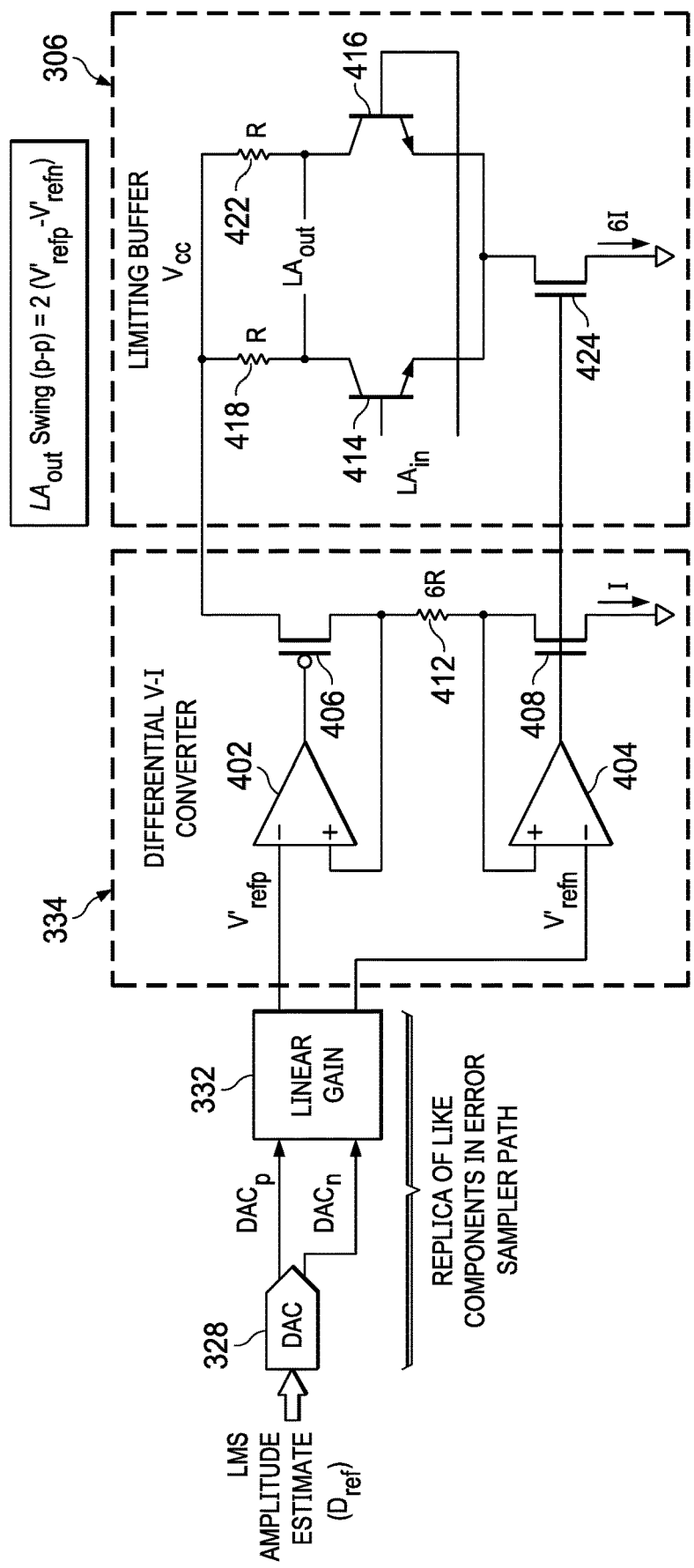
FIG. 4 is a diagram of an example voltage-to-swing circuit and an example limiting buffer circuit of baseline wander correction circuitry.

As shown in FIG. 4, the amplitude estimation code ($D_{ref}$) is input to DAC 328 to generate a differential analog signal ($DAC_p$ and $DAC_n$), which is input to linear gain circuit 332, which adjusts the gain and generates a differential analog signal ($V'_{refp}$ and $V'_{refn}$) DAC 328 and linear gain circuit 332 may each be a replica of its counterpart component in the error sampler path.

In an example, voltage-to-swing converter 334 is configured as a differential voltage-to-current (V-I) converter, as shown in FIG. 4. Differential V-I converter 334 includes two operational amplifiers (op amps) 402 and 404. The differential signal $V'_{ref}$, which comprises $V'_{refp}$ and $V'_{refn}$, output by linear gain circuit 332 is applied to the inverting inputs of op amps 402 and 404. That is, $V'_{refp}$ is applied to the inverting input of op amp 402, and $V'_{refn}$ is applied to the inverting input of op amp 404. The output of op amp 402 is coupled to the gate of a p-type metal-oxide-silicon field-effect transistor (p-MOSFET) 406, a drain of which is coupled to the non-inverting input of op amp 402. The source of p-MOSFET 406 is coupled to a supply voltage ($V_{cc}$). The output of op amp 404 is coupled to the gate of an n-type MOSFET 408, a current terminal of which is coupled to the non-inverting input of op amp 404. A resistor 412 (of resistance 6R) is coupled in the current path between the two non-inverting op amp inputs. With this configuration, the voltages at the input terminals of op amp 402 are approximately the same, and the voltages at the input terminals of op amp 404 are also approximately the same. Thus, the current (I) generated in n-MOSFET 408 of differential V-I converter 334 is $(V'_{refp} - V'_{refn})/6R$.

The tail current of limiting buffer 306 is constructed in current mirror configuration. Differential input signal $LA_{in}$ is applied to the bases of bipolar junction transistors (BJTs) 414 and 416, the emitters of which are coupled together and to a drain of an n-MOSFET 424. The gate of n-MOSFET 424 is coupled to the gate of n-MOSFET 408 and the output of op amp 404. Resistors 418 and 422 are coupled between the collectors of BJTs 414 and 416, respectively, and supply voltage $V_{cc}$. The relative resistance of each of resistors 418 and 422 is R, i.e., ⅙ the resistance of resistor 412, and n-MOSFET 424 is 6 times as large as n-MOSFET 408. Differential output signal $LA_{out}$ is taken at the collectors of BJTs 414 and 416.

With this current mirror configuration coupling of limited buffer 306 to differential V-I converter 334, a current mirror ratio of 6 is achieved. That is, a current (6I) is generated in limiting buffer 306 through n-MOSFET 424, and the peak-to-peak (p-p) swing of $LA_{out}$ is from $-(V'_{refp} - V'_{refn})$ to $+(V'_{refp} - V'_{refn})$. Thus, the p-p swing of $LA_{out}$ is controlled to be $2(V'_{refp} - V'_{refn})$.

Figure 5:
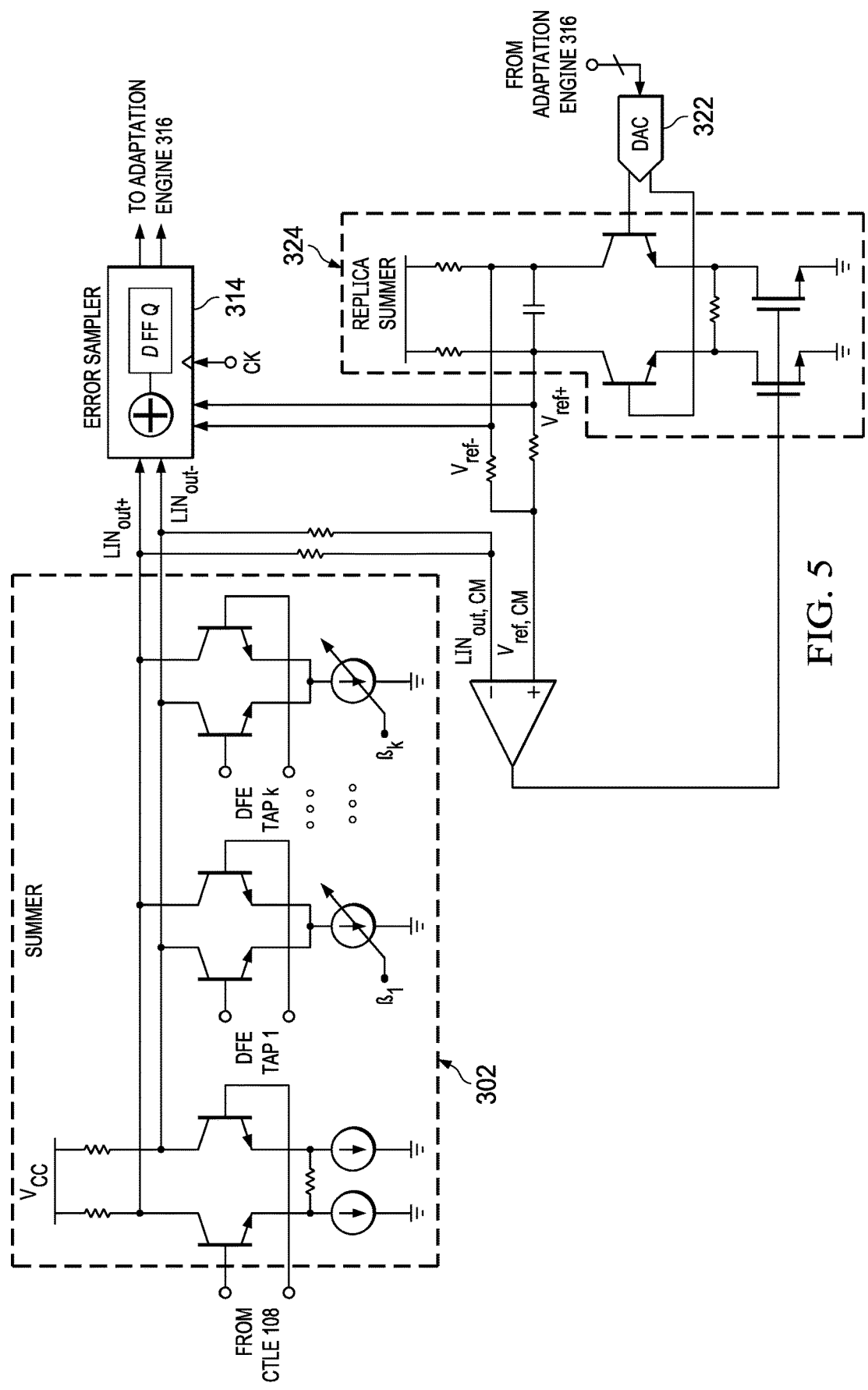
FIG. 5 is a diagram of an example summer and an example linear gain circuit.

FIG. 5 shows details of summer 302 and linear gain circuit 324, and their coupling to error sampler 314, summer 302 may be configured as disclosed in co-pending application Ser. No. 17/193,067 ('067 application), entitled "ERROR SAMPLER CIRCUIT", filed Mar. 5, 2021. The content of the '067 application is incorporated by reference herein in its entirety. In particular, summer 302 may be configured as shown in FIG. 3 of the '067 application, in which summer 302 may correspond to DFE circuitry 105 of the '067 application where input signals $V_{in}^+$ and $V_{in}^-$ of DFE circuitry 105 correspond to $LIN_{out}^+$ and $LIN_{out}^-$, respectively, in summer 302. DFE Taps 1 and 2 of DFE circuitry 105 of the '067 application may correspond to inputs for the FB signal from DFE FB 206 and the output signal from high-gain amplifier 312. Also, linear gain circuit 324 may correspond to buffer circuit 305 of the '067 application. The capacitor between the collector terminals of the transistors receiving the differential output signal of DAC 322 operates as a filtering capacitor. Error sampler 314 may also be configured as disclosed in the '067 application, and in particular as disclosed in FIGS. 2A and 2B thereof. In operation, linear gain circuit 324 functions as a replica summer.

DFE FB module 206 may also be implemented with the feedback as shown with respect to summer 302 of FIG. 5. There, the input marked DFE tap 1 is basically the current sampled bit $LA_{in}[n]$, the input marked DFE tap 2 is the previous bit $LA_{in}[n-1]$, and so on. All those weighted taps are summed by summer 302 of FIG. 3, i.e., $LIN_{out} = \alpha CTLEout + \beta_1 LA_{in}[n] + \beta_2 LA_{in}[n-2] + \ldots + \beta_k LA_{in}[n-k]$ + the input from high gain amplifier 312, where $\alpha$ is the forward gain of the leftmost differential pair in FIG. 5, and k is the number of DFE taps. The term "$\beta_1 LA_{in}[n] + \beta_2 LA_{in}[n-2] + \ldots + \beta_k LA_{in}[n-k]$" represents the function of DFE FB module 206 in FIG. 3. Summer 302 may include a separate differential pair of input transistors (not shown in FIG. 5) to accommodate the input from high gain amplifier 312.

Figure 6:
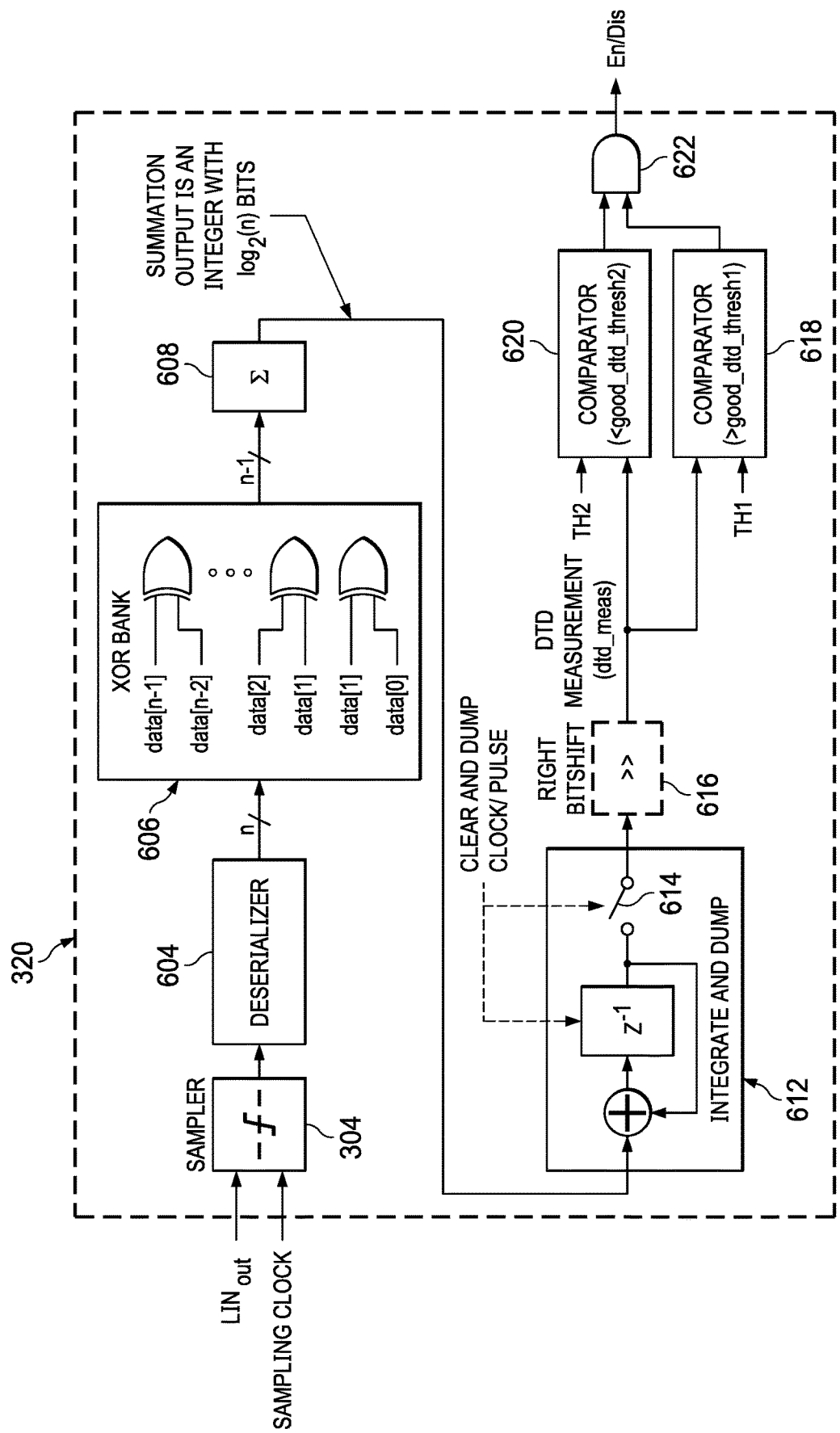
FIG. 6 is a diagram of an example pathological discriminator of amplitude estimation loop.

FIG. 6 is a diagram of an example pathological discriminator 320, which is configured to make data transition density (DTD) measurements with respect to the data output by summer 302, i.e., $LIN_{out}$, and determine whether a pathological pattern is present in the data. Pathological discriminator 320 may use data sampler 304, which extracts samples of data from $LIN_{out}$. Data sampler 304 also receives a phase-aligned sampling clock signal (not shown), which may originate from a clock generator that may be a local voltage-controlled oscillator (VCO) within a clock data recovery (CDR) circuit of a re-timer circuit. In an example, data sampler 304 samples the received data at each rising edge, each falling edge, or at each clock edge (rising and falling), and outputs resultant data.

In an example in which the received data is provided at about 10 Gb/s, every 100 picoseconds (e.g., 1-unit interval (UI) or 1 period of 10 Gb data), data sampler 304 samples the center of the data on the rising edge of the sampling clock signal to output a new bit of data. Deserializer 604 parallelizes the serial data stream output by sampler 304 into multiple, i.e., n, slower data streams, which are then processed in the digital domain. In other examples, the incoming data rate may be different, e.g., 270 Mb/s to 12 Gb/s, or even higher such as 50 Gb/s, 100 Gb/s or higher.

In an example, deserializer 604 includes multiple shift registers configured as serial-in, parallel out (SIPO). In an example application, e.g., digital video, n=64. In other examples, n may be another value such as 32. Accordingly, deserializer 604 receives n sequential bits from the serial data stream and outputs them onto n respective lines. The sampling clock signal may also be input to deserializer 604 where it gets divided down by n to which each of the n parallel output bits are timed. Thus, each of the n lines of data output by deserializer 604 is n times slower than the serial data stream it received.

Pathological discriminator 320 also includes digital logic circuitry 606 having an input coupled to the output of deserializer 604, a summer 608 having an input coupled to an output of digital logic circuitry 606, and an integrate and dump circuit 612 having an input coupled to an output of summer 608. Pathological discriminator 320 may be configured as disclosed in co-pending application Ser. No. 17/019,673, entitled "DATA TRANSITION TRACKING FOR RECEIVED DATA", filed Sep. 14, 2020. The content of this co-pending application is incorporated by reference herein in its entirety.

In an example, digital logic circuitry 606 is implemented as an XOR bank. The n parallel bits output by deserializer 604 are input to n−1 XOR gates, where each bit is XORed with a preceding bit. Thus, for n signals input to digital logic circuitry 606, n−1 signals are output.

Summer 608 receives and combines the n−1 signals into a single signal of integer values, each having $\log_2(n)$ bits, i.e., 6 bits when n=64. In the n=64 example, the single signal output by summer 608 ranges from 0 to 63, and the integer value of the summer output signal may be updated at a rate of 1/64 the original data rate, every deserializer clock edge.

The output signal of summer 608 is provided to integrate and dump circuit 612, which provides a time-averaged DTD measurement signal. Integrate and dump circuit 612 includes an accumulator having an adder, denoted by $\oplus$, coupled to summer 608 to receive its output, and a $z^{-1}$ register that receives the output of the adder and delays it by one clock cycle. The adder and $z^{-1}$ register are configured in a feedback loop in which the output of the $z^{-1}$ register is fed back to the adder. Integrate and dump circuit 612 includes a switch 614 having one terminal selectively couplable to the output of the $z^{-1}$ register and the other terminal coupled to an input of a right bitshift 616. The sum of the signal output by summer 608 and the signal from the $z^{-1}$ register are accumulated in the $z^{-1}$ register until a clear and dump clock edge or pulse is provided to the $z^{-1}$ register and switch 614.

Assertion of the clock edge or pulse closes switch 614, causes the current accumulated sum to be output from integrate and dump circuit 612 as the DTD measurement, and clears the $z^{-1}$ register. Switch 614 is then reopened again to restart the accumulator until another clock edge or pulse is provided.

Right bitshift 616 may be used to truncate the least significant bits (LSBs) to remove noise from the time-averaged DTD signal output from integrate and dump circuit 612, before applying the DTD signal against thresholds. If right bitshift 616 is not used, the output of integrate and dump circuit 612 is provided directly to comparators 618 and 620. The time-averaged DTD measurement signal is indicative of the number of data transitions, e.g., number of bit-1 to bit-0 transitions and vice versa, in a given number of bits.

Comparators 618 and 620 each have an input to receive the (LSB-truncated) time-averaged DTD measurement signal. Another input of comparator 618 is configured to receive lower threshold (TH1), and another input of comparator 620 is configured to receive an upper threshold (TH2). The thresholds TH1 and TH2 may be programmed into a register or some other memory device (not shown) that is coupled to comparators 618 and 620. Outputs of comparators 618 and 620 are coupled to respective inputs of AND gate 622. A enable/disable signal (En/Dis) is provided at the output of AND gate 622.

Comparator 618 determines whether the DTD measurement (dtd_meas) is greater than lower threshold TH1, and if so, asserts a high signal (e.g., 1). Comparator 620 asserts a high signal (e.g., 1) when its comparison indicates that the DTD measurement is less than upper threshold TH2. When both comparators 618 and 620 assert a high signal (e.g., 1), AND gate 622 also asserts a high signal (e.g., 1), indicating that the DTD measurement is within a range defined by TH1 at the lower end and TH2 at the upper end. Otherwise, if either or both of comparators 618/620 assert a low signal, the output of AND gate 622 likewise goes low, indicating that DTD measurement is not within the set range defined by TH1 and TH2. A low signal from AND gate 622 may correspond to a disable signal that is transmitted to SS-LMS 316 to disable its operation in amplitude estimation loop 204.

FIG. 7 is a diagram of an alternative implementation of the amplitude estimation loop, denoted 704 in FIG. 7, of baseline wander correction circuitry 200. In the example configuration of FIG. 7, instead of generating a digital amplitude estimate code by periodically sampling the error sampler code ($D_{ref}$), the error reference voltage ($V_{ref}$) is periodically sampled using an analog sample-and-hold (S/H) circuit 706. This implementation eliminates DAC 328 and linear gain circuit 332. DAC 708 is substantially the same as DAC 322 and linear gain circuit 710, which outputs $V_{ref}$ is substantially the same as linear gain circuit 324. Thus, the implementation of FIG. 7 offers potential power and space savings, but adds the complexity of an analog S/H circuit.

Figure 8:
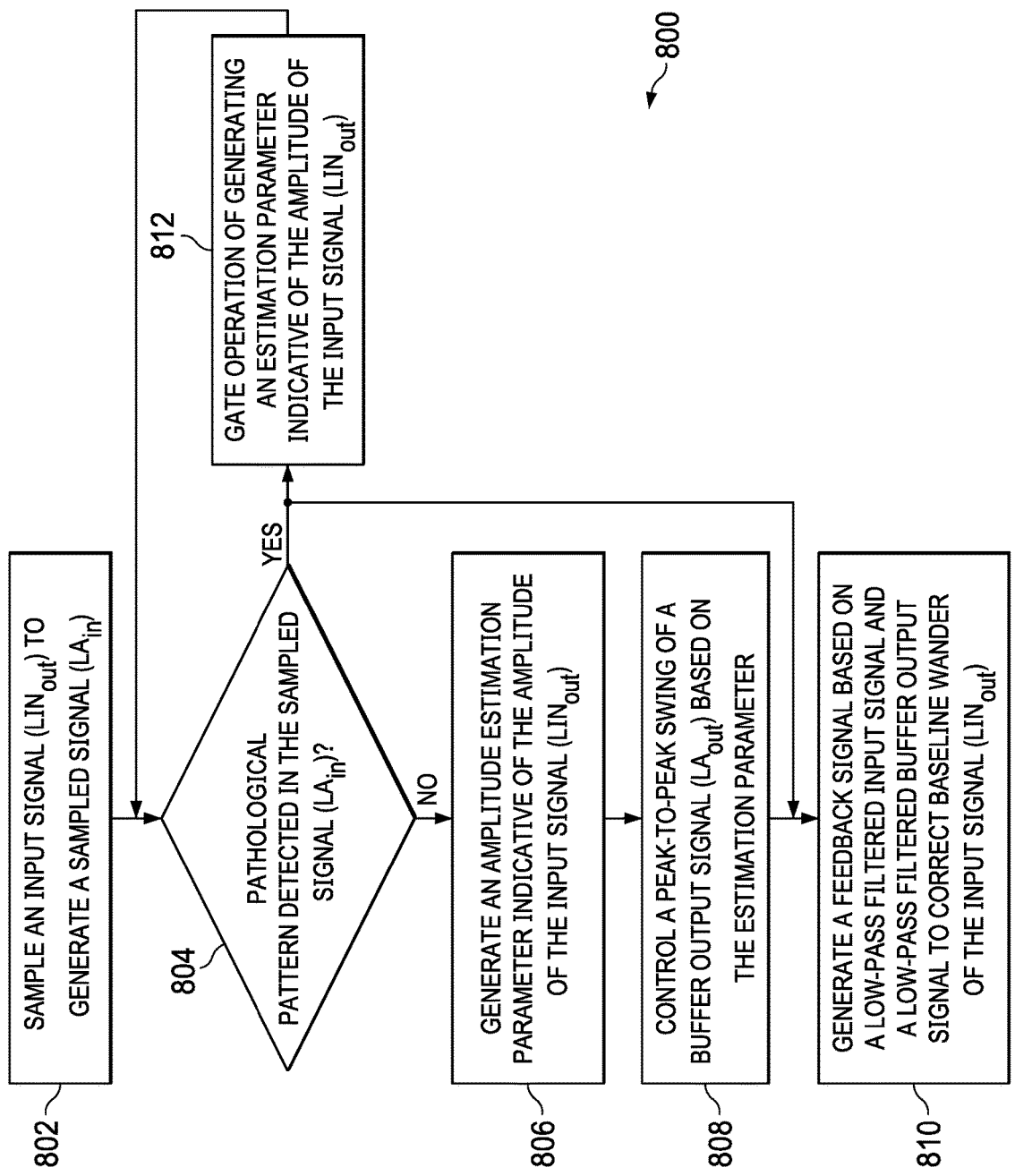
FIG. 8 is a flow diagram of an example process of operating baseline wander correction circuitry.

FIG. 8 is a flow diagram of an example method/process 800 of operating example baseline wander correction circuitry to correct baseline wander. For example, method 800 may be implemented in the circuitry (or portions thereof) shown in FIGS. 2-7.

At operation 802, an input signal, e.g., $LIN_{out}$, is sampled to generate a sampled signal, e.g., $LA_{in}$. The sampled signal, $LA_{in}$, is then analyzed in operation 804 to determine whether the signal has any pathological data pattern. If not ("no" at operation 804), an estimation parameter indicative of the amplitude of $LIN_{out}$ is generated in operation 806. Such estimation parameter may be V'ref. In operation 808, V'ref is used to generate a swing control parameter that is used to control peak-to-peak swing of a buffer output signal, e.g., $LA_{out}$.

In operation 810, a feedback signal is generated, which is one of the inputs, along with the output of CTLE 108, to summer 302. The feedback signal is generated based on a low-pass filtered input signal, e.g., $LIN_{lpf}$, and a low-pass filtered buffer output signal, e.g., $LA_{lpf}$. In an example, these low-pass filtered signals are input to a high-gain amplifier, the output of which is the feedback signal. The feedback signal is used in a baseline wander correction loop to correct baseline wander of $LIN_{out}$.

Operations 806 and 808 are subject to there being no pathological data pattern detected in the sampled signal, e.g., $LA_{in}$. If such a pathological data pattern is detected ("yes" at operation 804), operation 806 is gated, e.g., by gating operation of an equalization adaption engine, e.g., SS-LMS 316. In this case, amplitude estimation stops until no pathological data pattern is detected. Thus, in the event of pathological data pattern detection ("yes at operation 804), flow continues to the gating operation of 812, bypassing operations 806 and 808. Flow from the "yes" branch of operation 812 also continues to operation 810. That is, in an example, baseline wander correction loop 202 continues to run, generating the feedback signal of operation 812 whether or not the data is detected as pathological.

Figure 9:
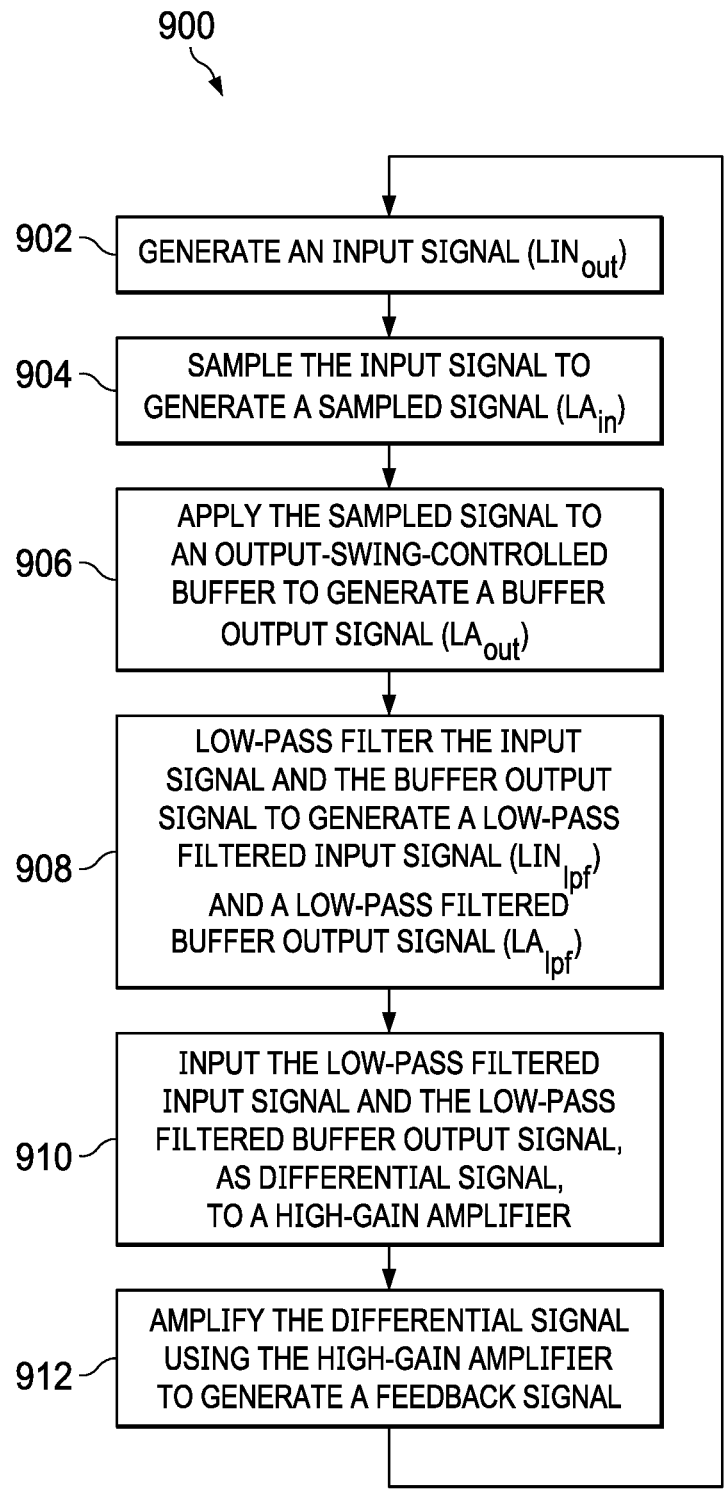
FIG. 9 is a flow diagram of an example process of operating a baseline wander correction loop of baseline wander correction circuitry.

FIG. 9 is a flow diagram of an example method/process 900 of operating an example baseline wander correction loop, which may be part of example baseline wander correction circuitry. For example, method 900 may be implemented in the circuitry (or portions thereof) shown in FIGS. 2-7.

At operation 902, an input signal, e.g., $LIN_{out}$, is generated, which signal is then sampled in operation 904 to generate a sampled signal, e.g., $LA_{in}$. In operation 906, the sampled signal is applied to an input of an output-swing-controlled buffer, e.g., limiting buffer 306, to generate a buffer output signal, e.g., $LA_{out}$. In operation 908, $LA_{out}$ and $LIN_{out}$ are both low-pass filtered to generate $LA_{lpf}$ and $LIN_{lpf}$, respectively. These low-pass filtered signals are then input, as a differential signal, to a high-gain amplifier, e.g., high-gain amplifier 312, in operation 910. In operation 912, the differential signal is amplified by the high-gain amplifier to generate a feedback signal.

This feedback signal from the high-gain amplifier is applied as an input, along with the output of CTLE 108 and the feedback signal from DFE FB 206, to summer 302 to generate $LIN_{out}$, which is continually adjusted according to the applied feedback.

Figure 10:
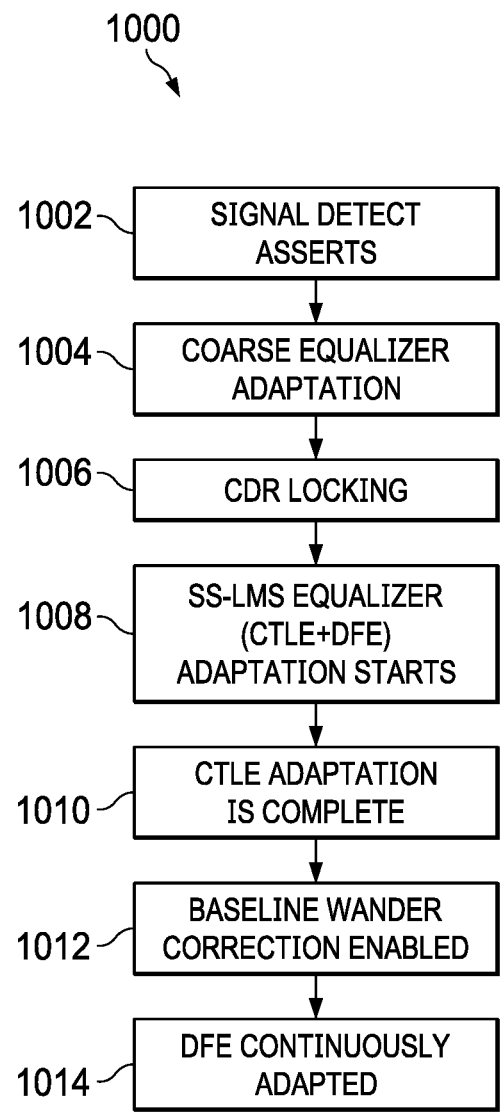
FIG. 10 is a flow diagram of an example process of signal equalization including baseline wander correction.

FIG. 10 is a flow diagram of an example method/process 1000 of signal equalization that includes baseline wander correction. The operations of FIG. 10 may be performed by a state machine, which may be included in receiver 106. At operation 1002, an incoming signal, e.g., at the input of receiver 106, is detected, triggering the start of coarse equalizer adaptation, which is performed in operation 1004. Coarse equalizer adaptation may be performed as disclosed in co-pending application Ser. No. 17/573,144, entitled "COARSE EQUALIZER ADAPTATION AND RATE DETECTION FOR HIGH-SPEED RETIMERS", filed Jan. 11, 2022. The content of this co-pending application is incorporated by reference herein in its entirety.

Generally, in coarse equalizer adaptation 1004, the system may be initialized to start at the highest clock rate and at a select equalization setting, which may be represented by an index in an equalization (EQ) index table. The starting index may be zero, or any other suitable index. The starting index may be programmable through registers. For example, in an application using a long channel, the user may program the starting index to be a reasonable non-zero value for fast coarse adaptation and rate detection. Each index (setting) in the EQ index table may be a combination of CTLE and DFE settings, or CTLE-only settings. For example, each index (setting) in the EQ index table may be a unique combination of a CTLE value and three DFE tap values. The EQ index table may have any suitable number of settings, e.g., ten settings (indices). Data metrics may be measured, and used to change the equalization setting until certain conditions are met, at which time CDR locking is attempted in operation 1006. Once CDR has successfully locked, SS-LMS equalization starts 1008. After CTLE adaptation is complete (1010), baseline wander correction is enabled in operation 1012. Baseline wander correction may be performed as disclosed herein.

Further finer adaptation of DFE may then be continuously carried out in operation 1014 using any of various techniques. For example, the coarse equalization setting index may be used as a starting point for SS-LMS continuous adaption to achieve the best bit error rate (BER).

Each of FIGS. 8, 9 and 10 depicts one possible set and order of operations. In each case, some operations may be combined or performed substantially simultaneously. Additional operations may be performed as well.

Figure 11:
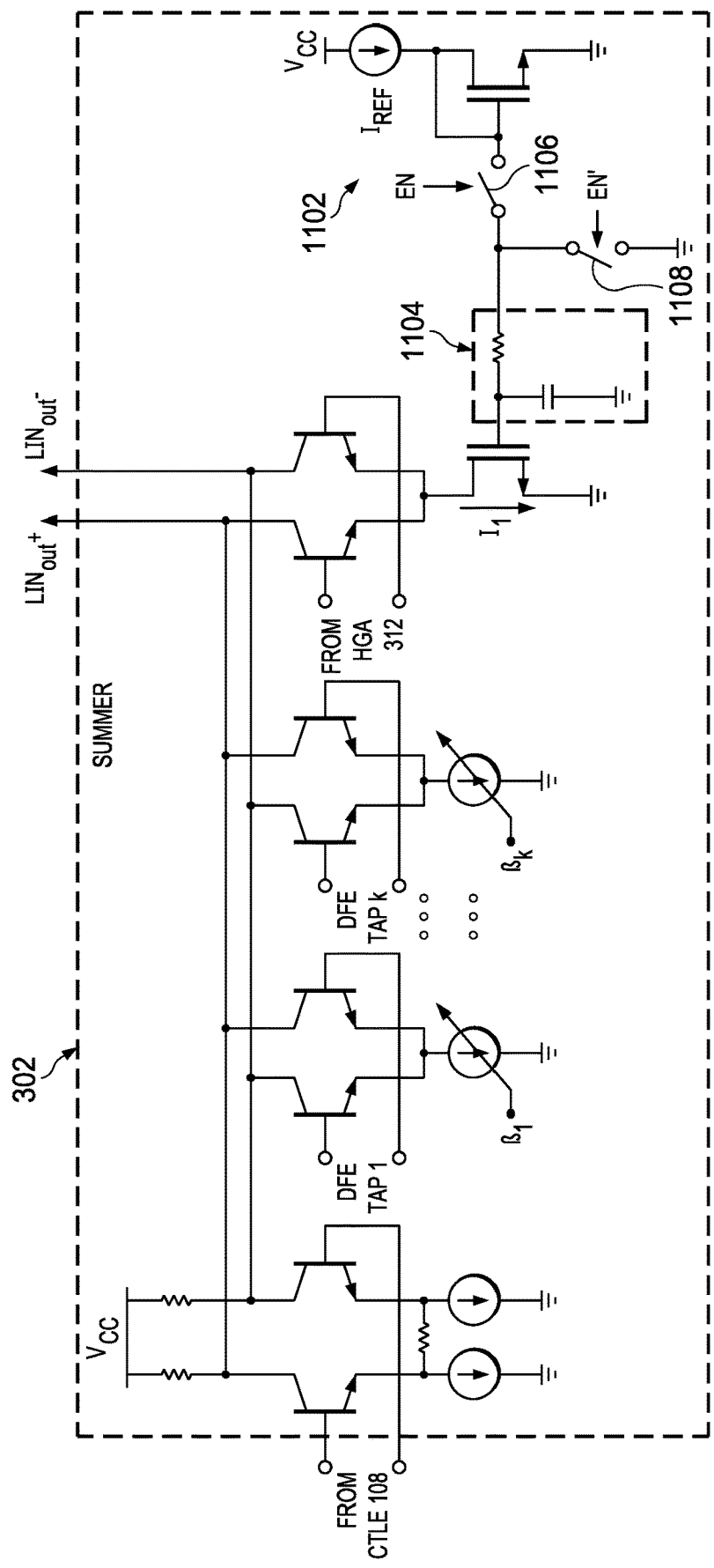
FIG. 11 is a diagram showing another example of a summer in a baseline wander correction loop.

FIG. 11 shows another example of summer 302. As noted above in connection with FIG. 5, summer 302 also includes a differential pair of input transistors for the input from high gain amplifier (HGA) 312, which transistors are shown in FIG. 11. In an example, the sources of the differential pair of input transistors are commonly coupled to a drain of an n-type MOSFET, through which a current $I_1$ is generated via a current mirror 1102 coupled to the n-type MOSFET. Current mirror 1102 includes a reference current source that delivers a current $I_{REF}$. In some instances, too abrupt application of the output of high gain amplifier 312 to summer 302 may cause the CDR to temporarily lose lock. The configuration of FIG. 11 avoids or reduces the likelihood of losing CDR lock by providing a mechanism to gradually ramp the HGA output to summer 302 to allow the system to stabilize. To this end, current mirror 1102 is coupled via a low pass filter 1104 and a pair of switches 1106 and 1108. In an example, low pass filter 1104 has a cut-off frequency of approximately 20 kHz. In an example, when baseline wander correction is enabled in operation 1012 of FIG. 10, the controlling state machine directs that an enable signal (EN) be applied to switch 1106 to close it, while switch 1108 is opened. With this configuration, the current $I_1$ more gradually ramps up to its final value according to the time constant of low pass filter 1104, which gradually enables the HGA output to summer 302. Hence, current mirror 1102 and low pass filter 1104 may be considered a ramping circuit.

Figure 12A:
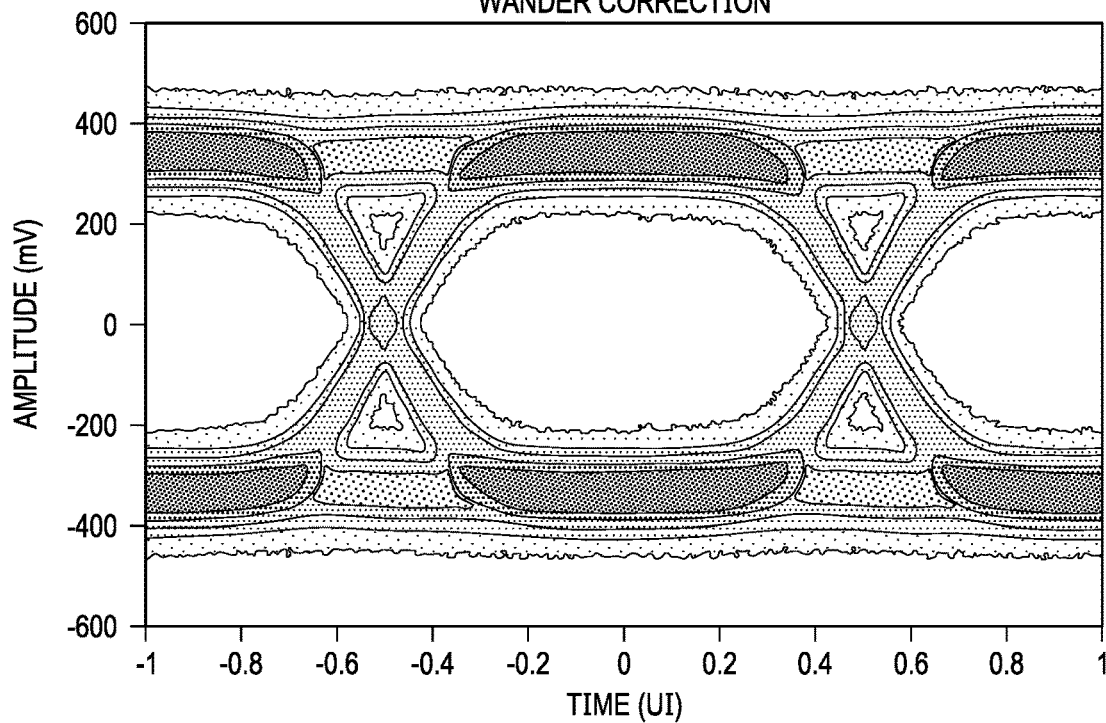
FIGS. 12A and 12B show eye diagrams of a data sampler input signal without and with baseline wander correction in a simulation.
Figure 12B:
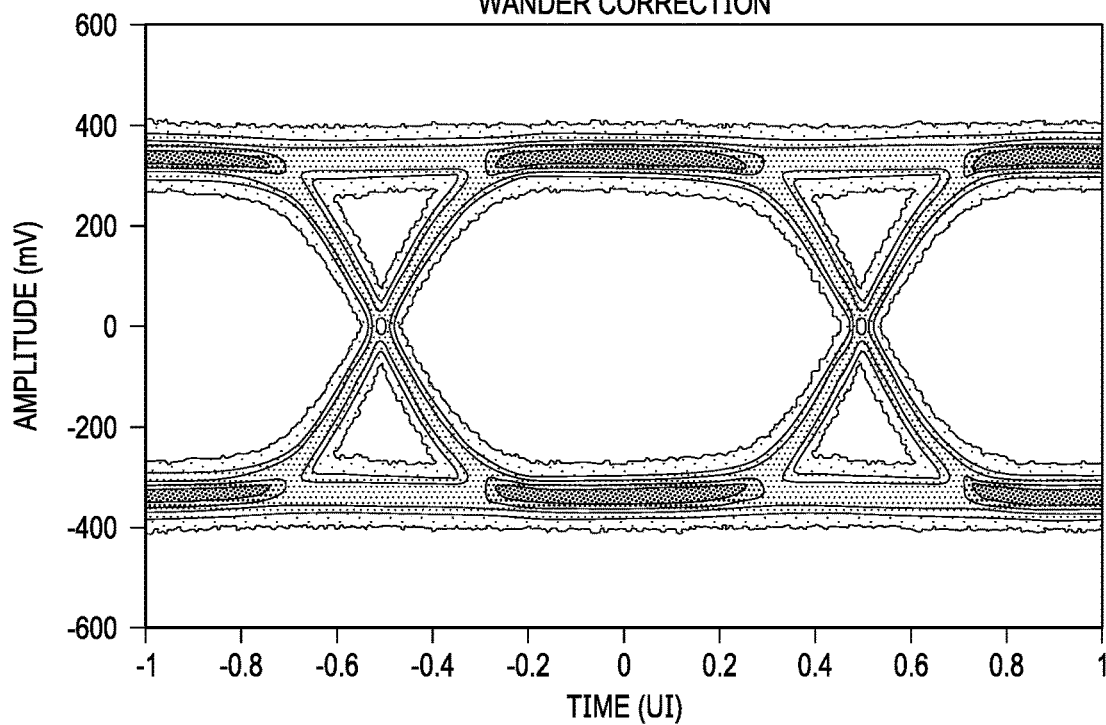
Figure 13A:
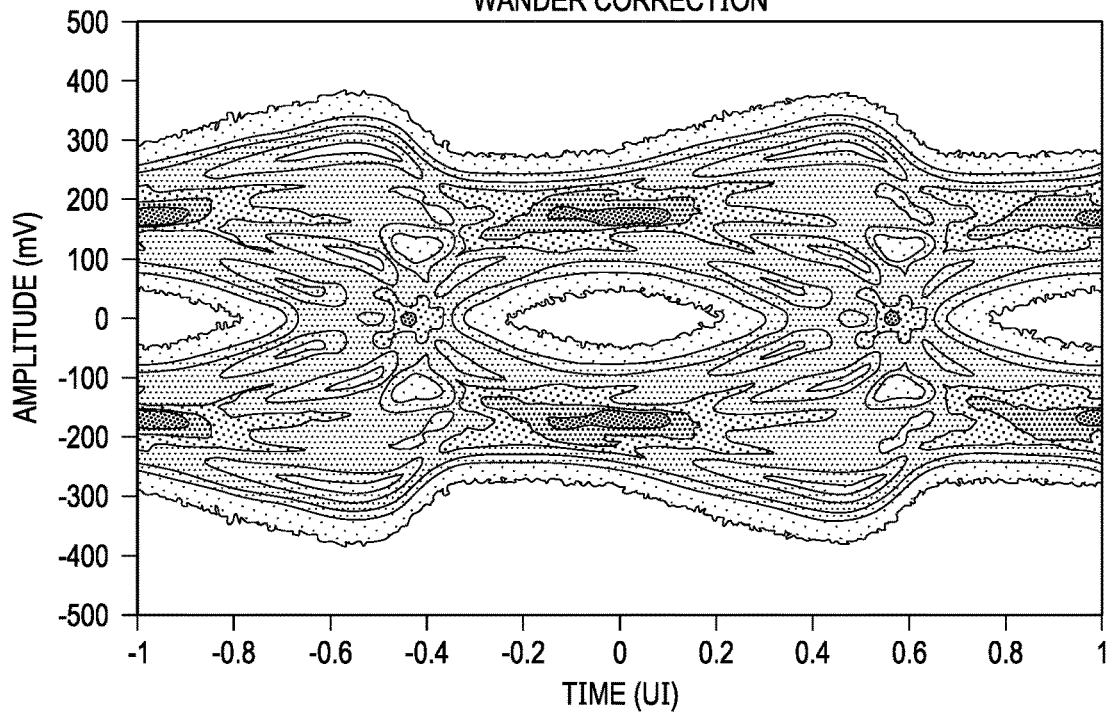
FIGS. 13A and 13B show eye diagrams of a data sampler input signal without and with baseline wander correction in another simulation.
Figure 13B:
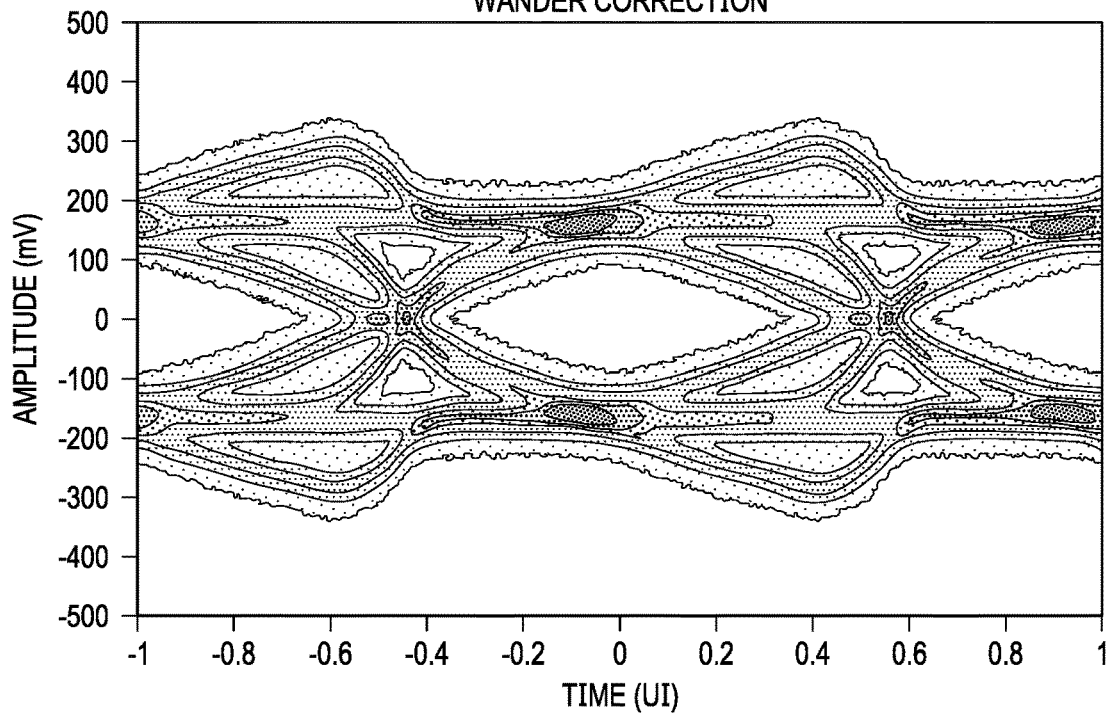

In one simulation, with an incoming data rate of 3 Gb/s, a pseudorandom binary sequence (PRBS) with a pathological pattern sampled approximately every 50 μs, a 95 m cable length as the communication channel, and a 0.5 μF AC coupling capacitor, approximately 100 mV of baseline wander was observed in $LIN_{out}$ without baseline wander correction as shown in FIG. 12A. With baseline wander correction, the result in FIG. 12B was obtained. In another simulation, with an incoming data rate of 3 Gb/s, a pseudorandom binary sequence (PRBS) with a pathological pattern sampled approximately every 50 μs, a 220 m cable length as the communication channel, and a 0.5 μF AC coupling capacitor, $LIN_{out}$ without and with baseline wander correction is shown in FIGS. 13A and 13B, respectively.

Various examples of systems, circuitry and methods use a baseline wander correction loop and an amplitude estimation loop to correct baseline wander in a data sampler input signal, while controlling the amplitude of a buffer output signal to be approximately the same as the amplitude of the data sampler input signal to improve the baseline wander correction. The amplitude of data sampler input signal is estimated, and such estimate is used to control the amplitude of the buffer output signal. A pathological discriminator may be employed to disable the amplitude estimation function when a pathological data pattern is detected in the data sampler input signal. By performing the amplitude estimation only using non-pathological data, accuracy of the amplitude estimation is improved and the estimate is free from baseline wander influence. In some applications, e.g., re-timer applications, the amplitude estimation loop may leverage the on-board equalization adaptation engine to provide the error sampler code from which the amplitude estimate is derived.

The term "coupled" is used throughout the specification. The term and derivatives thereof may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

An element that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the element, or a combination thereof.

As used herein, the terms "terminal" and "node" are used interchangeably and may also encompass the terms "interconnection", "pin" and "lead". Unless specifically stated to the contrary, these terms are generally used to mean an interconnection between or a terminus of a device element, a circuit element, an integrated circuit, a device or other electronic or semiconductor component.

A circuit or device that is described herein as including certain components may instead be adapted to be coupled to those components to form the described circuitry or device. For example, a structure described as including one or more semiconductor elements may instead include only the semiconductor elements within a single physical device (e.g., a semiconductor die and/or integrated circuit (IC) package) and may be adapted to be coupled to other elements and/or voltage or current sources to form the described structure either at a time of manufacture or after a time of manufacture, for example, by an end-user and/or a third-party.

Circuits described herein are reconfigurable to include the replaced components to provide functionality at least partially similar to functionality available prior to the component replacement. A component, unless otherwise stated, may be representative of multiple instances of components configured to perform the stated functionality.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about" or "approximately" preceding a value means+/−10 percent of the stated value.

Modifications of the described examples are possible, as are other examples, within the scope of the claims. For example, the SS-LMS adaptation engine and the pathological discriminator may be implemented in analog using high-speed logic gates, although such implementation would likely increase power consumption. Moreover, features described herein may be applied in other environments and applications consistent with the teachings provided.

What is claimed is:

1. Baseline wander correction circuitry, comprising:
   a first loop having a data input, a control signal input, a first output and a second output, the data input configured to receive an equalized data signal;
   a second loop having first and second inputs coupled to the first and second outputs of the first loop, respectively, and having a control signal output coupled to the control signal input of the first loop; and
   a feedback circuit having an input directly coupled to the second output of the first loop and having an output coupled to a feedback input of the first loop, the first loop including an amplifier having first and second inputs and an output, the second input of the amplifier coupled to the first output of the first loop, the first loop configured to generate a signal at the second output based on a signal received on the data input of the first loop, a signal generated at the output of the amplifier and a signal received on the feedback input of the first loop.

2. The baseline wander correction circuitry of claim 1, wherein the first loop includes:
   a summer having the data input and the feedback input of the first loop, the summer further including an amplifier input coupled to the output of the amplifier, and a summer output; and
   a data sampler having an input coupled to the summer output, and having an output configured to output a data sampler output signal, wherein the second input of the amplifier is coupled to the summer output.

3. The baseline wander correction circuitry of claim 2, wherein the first loop includes:
   a controllable buffer having an input configured to receive the data sampler output signal, having the control signal input of the first loop, and having an output coupled to the first input of the amplifier.

4. The baseline wander correction circuitry of claim 3, wherein the first loop includes:
   a low-pass filter having a first and second inputs and first and second outputs, the first input of the low-pass filter coupled to the output of the controllable buffer, the second input of the low-pass filter coupled to the summer output, the first output of the low-pass filter coupled to the first input of the amplifier, and the second output of the low-pass filter coupled to the second input of the amplifier.

5. The baseline wander correction circuitry of claim 3, wherein the second loop includes:
   an error sampler having the first input of the second loop, an error reference voltage input, and an error signal output;
   an equalization adaptation engine having an error signal input, the second input of the second loop, and an error sampler code output, the error signal input coupled to the error signal output, and the second input of the second loop configured to receive the data sampler output signal; and
   a voltage-to-swing controller having an amplitude estimation parameter input and the control signal output of the second loop, the amplitude estimation parameter input configured to receive a gain-adjusted analog signal generated based on an error sampler code from the equalization adaptation engine, and the control signal output coupled to the control signal input of the controllable buffer.

6. The baseline wander correction circuitry of claim 5, wherein the error reference voltage input is configured to receive an error reference voltage signal generated based on the error sampler code.

7. The baseline wander correction circuitry of claim 6, further comprising:
   a pathological discriminator having an input configured to receive the data sampler output signal and an output coupled to a control input of the equalization adaptation engine.

8. The baseline wander correction circuitry of claim 7, wherein the pathological discriminator is configured to disable the equalization adaptation engine when the pathological discriminator detects a pathological data pattern in the data sampler output signal.

9. The baseline wander correction circuitry of claim 3, wherein the second loop includes:
   an error sampler having the first input of the second loop, an error reference voltage input, and an error signal output;
   an equalization adaptation engine having an error signal input, the second input of the second loop, and an error sampler code output, the error signal input coupled to the error signal output, and the second input of the second loop configured to receive the data sampler output signal;
   digital-to-analog conversion and gain adjusting circuitry having an input coupled to the error sampler code output and having an output coupled to the error reference voltage input;
   a sample-and-hold (S-H) circuit having an input coupled to the output of the digital-to-analog conversion and gain adjusting circuitry, the S-H circuit configured to sample an error reference voltage signal output by the digital-to-analog conversion and gain adjusting circuitry and generate an amplitude estimation signal; and
   a voltage-to-swing controller having an amplitude estimation input configured to receive the amplitude estimation signal and having the control signal output of the second loop, the amplitude estimation input configured to receive the amplitude estimation signal, and the control signal output coupled to the control signal input of the controllable buffer.

10. A system, comprising:
    a first loop including circuitry configured to:
    receive a data input signal,
    sum the data input signal with a first feedback signal to generate a data sampler input signal, and
    control a low frequency portion of the data sampler input signal to be approximately equal to a low frequency portion of a buffer output signal; and a second loop including circuitry configured to control an amplitude of the buffer output signal to be approximately the same as an amplitude of the data sampler input signal.

11. The system of claim 10, further comprising:
a feedback circuit coupled to the first loop and configured to provide the first feedback signal.

12. The system of claim 11, wherein the first loop includes:
a ramping circuit configured to gradually enable a second feedback signal output by a high-gain amplifier in the sum operation when the first loop is enabled.

13. The system of claim 12, wherein the first loop includes:
a low-pass filter configured to perform low pass filtering on the buffer output signal and on the data sampler input signal and to provide a low-pass filtered buffer output signal and a low-pass filtered data sampler input signal to the high-gain amplifier.

14. The system of claim 10, wherein the first loop includes:
a limiting buffer configured to be controlled by the second loop to control a peak-to-peak swing of the buffer output signal.

15. The system of claim 10, wherein the second loop includes:
a gated equalization adaptation engine configured to generate an error sampler code that is used to estimate an amplitude of the data sampler input signal, wherein the gated equalization adaptation engine is configured to be disabled when a pathological data pattern is detected in a data sampler output signal.

16. The system of claim 15, wherein the second loop includes:
a digital-to-analog converter (DAC) coupled to the gated equalization adaption engine;
a linear gain circuit coupled to the DAC; and
a voltage-to-swing converter coupled to the linear gain circuit.

17. The system of claim 16, wherein the voltage-to-swing converter is configured as a voltage-to-current converter.

18. A method, comprising:
sampling an input signal to generate a sampled signal;
applying the sampled signal to an output-swing-controlled buffer to generate a buffer output signal;
low-pass filtering the input signal and the buffer output signal to generate a low-pass filtered input signal and a low-pass filtered buffer output signal;
inputting the low-pass filtered input signal and the low-pass filtered buffer output signal as a differential signal to an amplifier; and
amplifying the differential signal using the amplifier to generate a feedback signal.

19. The method of claim 18, further comprising:
estimating an amplitude of the input signal; and
controlling a peak-to-peak swing of the buffer output signal based on the estimating.

20. The method of claim 19, further comprising:
determining whether the input signal contains a pathological data pattern; and
disabling estimating the amplitude of the input signal when the pathological data pattern is detected.

21. The method of claim 19, further comprising:
generating a control signal to control peak-to-peak swing of the buffer output signal based on the estimated amplitude of the input signal.

22. The method of claim 19, wherein the estimating of the amplitude of the input signal is performed in part using an equalization adaptation engine also used for equalization of the input signal.

23. A circuit comprising:
first and second operational amplifiers, each having first and second inputs and an output, the first inputs configured to receive a differential input voltage signal;
a p-type metal-oxide-silicon field-effect (PMOS) transistor having a gate terminal and first and second current terminals, the gate terminal of the PMOS transistor coupled to the output of the first operational amplifier, the first current terminal of the PMOS transistor adapted to be coupled to a supply voltage, and the second current terminal of the PMOS transistor coupled to the second input of the first operational amplifier;
an n-type metal-oxide-silicon field-effect (NMOS) transistor having a gate terminal and first and second current terminals, the gate terminal of the NMOS transistor coupled to the output of the second operational amplifier, the first current terminal of the NMOS transistor adapted to be coupled to ground, and the second current terminal of the NMOS transistor coupled to the second input of the second operational amplifier; and
a first resistive element coupled between the second current terminals of the PMOS and NMOS transistors.

24. The circuit of claim 23, wherein the first input of each of the first and second operational amplifiers is an inverting input terminal, and the second input of each of the first and second operational amplifiers is a non-inverting input terminal.

25. The circuit of claim 23, further comprising:
a buffer coupled to the gate terminal of the NMOS transistor.

26. The circuit of claim 25, wherein the buffer is configured to receive a buffer differential input signal, and in response to receiving the buffer differential input signal, output a buffer differential output signal having a peak-to-peak swing that is limited by the differential input voltage signal.

27. The circuit of claim 25, wherein the buffer comprises:
first and second input transistors, each having a control terminal and first and second current terminals, the control terminals of the input transistors configured to receive a differential input voltage signal;
second and third resistive elements, the second resistive element coupled to the first current terminal of the first input transistor, the third resistive element coupled to the first current terminal of the second input transistor; and
a mirror NMOS transistor having a gate terminal and first and second current terminals, the gate terminal of the mirror NMOS transistor coupled to the gate terminal of the NMOS transistor, the first current terminal of the mirror NMOS transistor adapted to be coupled to ground, and the second current terminal of the mirror NMOS transistor coupled to the second current terminals of the first and second input transistors.

28. The circuit of claim 27, wherein:
each of the second and third resistive elements has the same resistance value R, and the first resistive element has a resistance value of x*R, and
the NMOS transistor has a width of W, and the mirror NMOS transistor has a width of x*W,
where x is an integer of 1 or more.

29. The circuit of claim 28, wherein, in operation, a current of value I flows through the NMOS transistor and a current of value x*I flows through the mirror NMOS transistor.

\* \* \* \* \*